(12) United States Patent
Kim

(10) Patent No.: US 6,780,291 B2
(45) Date of Patent: Aug. 24, 2004

(54) SELF-ANNEALED THIN FILM DEPOSITION PROCESS

(75) Inventor: Jai-Young Kim, Sewickley, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/227,756

(22) Filed: Aug. 26, 2002

(65) Prior Publication Data

US 2003/0228490 A1 Dec. 11, 2003

Related U.S. Application Data

(60) Provisional application No. 60/387,084, filed on Jun. 7, 2002.

(51) Int. Cl.[7] .............................................. C23C 14/32
(52) U.S. Cl. .................................................. 204/192.2
(58) Field of Search .......................... 204/192.2, 192.18

(56) References Cited

U.S. PATENT DOCUMENTS

| | | | |
|---|---|---|---|
| 4,093,453 A | | 6/1978 | Makino et al. |
| 5,066,552 A | * | 11/1991 | Howard et al. .......... 204/192.2 |
| 5,363,794 A | | 11/1994 | Lairson et al. |
| 5,603,766 A | | 2/1997 | Visokay et al. |
| 5,824,409 A | | 10/1998 | Sellmyer et al. |
| 5,989,728 A | | 11/1999 | Coffey et al. |
| 6,007,623 A | | 12/1999 | Thiele et al. |
| 6,033,536 A | | 3/2000 | Ichihara et al. |
| 6,068,739 A | | 5/2000 | Suzuki et al. |
| 6,086,974 A | | 7/2000 | Thiele et al. |
| 6,139,907 A | | 10/2000 | Sellmyer et al. |
| 6,183,606 B1 | * | 2/2001 | Kuo et al. ............. 204/192.15 |
| 6,190,516 B1 | | 2/2001 | Xiong et al. |
| 6,277,484 B1 | | 8/2001 | Shimoda et al. |
| 6,296,955 B1 | | 10/2001 | Hossain et al. |
| 6,331,364 B1 | | 12/2001 | Baglin et al. |
| 6,377,414 B1 | | 4/2002 | Wang |

OTHER PUBLICATIONS

Suzuki et al. "Preparation of ordered Fe–Pt thin films for perpendicular magnetic recording media", Journal of Magnetism and Magnetic Materials, 193, 1999, 85–88.*
Park et al. "Effects of Annealing Condition on the Structural and Magnetic Properties of FePt thin Films", IEEE Transactions on Magnetics, vol. 35, No. 5 Sep. 1999.*
Christodoulides et al. "CoPt and FePt thin films for high density recording media" Journal of Applied Physics, vol. 87, No. 9, pp. 6938–6940.*

(List continued on next page.)

Primary Examiner—Rodney G. McDonald
(74) Attorney, Agent, or Firm—Robert P. Lenart, Esq.; Pletragallo, Bosick & Gordon

(57) ABSTRACT

A method of manufacturing a thin film of magnetic material, comprises sputtering magnetic material from a target to a substrate to form a thin film of the magnetic material on the substrate, wherein the ratio of sputtering power in Watt to sputtering pressure in mTorr is greater than one. Thin films of magnetic material made according to the method and magnetic storage media including a thin film of magnetic material made according to the method are also included.

14 Claims, 4 Drawing Sheets

OTHER PUBLICATIONS

M. L. Williams et al., "Analytical Model of the Write Process in Digital Magnetic Recording," *AIP Conf. Proc.*, vol. 5, 1972, pp. 738–742.

B. K. Middleton et al., "Perpendicular Recording," *IEEE Conf. Pros.*, vol. 54, 1982, pp. 181–192.

M. R. Visokay et al., "Direct Formation of Ordered CoPt and FePt Compound Thin Films by Sputtering," *Appl. Phys. Lett.*, vol. 66, No. 13, Mar. 27, 1995, pp. 1692–1694.

R. F. C. Farrow et al., "Growth Temperature Dependence of Long–Range Alloy Order and Magnetic Properties of Epitaxial $Fe_xPt_{1-x}$ ($X \cong 0.5$) Films," *Appl. Phys. Lett.*, vol. 69, No. 8, Aug. 19, 1996, pp. 1166–1168.

M. H. Hong et al., Microstructure of FePt/Pt Magnetic Thin Films With High Perpendicular Coercivity, *Journal of Applied Physics*, vol. 84, No. 8, Oct. 15, 1998.

T. Suzuki et al., "Preparation of Ordered Fe–Pt Thin Films for Perpendicular Magnetic Recording Media," (Abstract), *Journal of Magnetism and Magnetic Materials*, vol. 193, Issues 1–3, Mar. 1999, pp. 85–88.

T. Suzuki et al., "Fe–Pt Media for Perpendicular Magnetic Recording," *IEEE Transactions on Magnetics*, vol. 35, No. 5, Sep. 1999, pp. 2748–2750.

B. Bian et al., "Fabrication and Nanostructure of Oriented FePt Particles," *Journal of Applied Physics*, vol. 87, No. 9, May 1, 2000, pp. 6962–6964.

J. A. Christodoulides et al., "CoPt and FePt Thin Films for High Density Recording Media," *Journal of Applied Physics*, vol. 87, No. 9, May 1, 2000, pp. 6938–6940.

Y.–N. Hsu et al., "In Situ Ordering of FePt Thin Films by Using Ag/Si and Ag/$Mn_3$Si/Ag/Si Templates," *IEEE Transactions on Magnetics*, vol. 36, No. 5, Sep. 2000, pp. 2945–2947.

S.–R. Lee et al., "Rapid Ordering of Zr–Doped FePt Alloy Films," *Applied Physics Letters*, vol. 78, No. 25, Jun. 18, 2001, pp. 4001–4003.

S. Jeong et al., "Atomic Ordering and Coercivity Mechanism in FePt and CoPt Polycrystalline Thin Films," *IEEE Transactions on Magnetics*, vol. 37, No. 4, Jul. 2001, pp. 1299–1301.

Y. K. Takahashi et al., "Low–Temperature Fabrication of High–Coercivity $L1_0$ Ordered FePt Magnetic Thin Films by Sputtering ," *Jpn. J. Appl. Phys.*, vol. 40, Pt. 2, No. 12B, Dec. 2001, pp. L1367–L1369.

* cited by examiner

SELF-ANNEALED THIN FILM DEPOSITION PROCESS

CROSS REFERENCE TO RELATED APPLICATION

This application claims the benefit of United States Provisional Patent Application Ser. No. 60/387,084, filed Jun. 7, 2002.

STATEMENT REGARDING FEDERALLY SPONSORED RESEARCH OR DEVELOPMENT

This invention was made with the United States Government support under Agreement No. 70NANB1H3056 awarded by the National Institute of Standards and Technology (NIST). The United States Government has certain rights in the invention.

FIELD OF THE INVENTION

This invention relates to the fabrication of thin films of magnetic material by sputter deposition.

BACKGROUND OF THE INVENTION

To increase the areal recording densities in both longitudinal and perpendicular magnetic information data storage media, a reduction in the recording film thickness is desirable. However, as the film thickness is reduced for narrow transition parameters in both longitudinal and perpendicular recording films, the magnetic volume energy ($K_U \times V$) of magnetic grains in the films can be less than the thermal fluctuation energy ($K_B \times T$) of the magnetic recording media, which limits storage density due to superparamagnetic effects. The magnetic energy should be larger than thermal fluctuation energy to safely store information in the recorded magnetic bit pattern. This can be expressed as:

$$(K_U \times V) > (k_B \times T) \quad \text{(Equation 1)}$$

where, $K_U$ is the magnetic anisotropy energy of a magnetic grain; V is the magnetic grain volume; $k_B$ is Boltzman's constant; and T is the absolute temperature.

To enhance the magnetic energy in ultra thin storage films, the development of recording films with large magnetic anisotropy energy has received much attention. Among the recording films, an L1o phase ordered FCT (Face Centered Tetragonal) FePt film is a strong candidate for high anisotropy energy films beyond $10^7$ ergs/cc.

FePt thin films can be fabricated though sputter deposition. An as-deposited FePt film forms a chemically disordered FCC (Face Centered Cubic) crystallographic structure with soft magnetic properties in its hysteresis loop, such as a coercivity of less than a few hundred Oe. It is well known that an external thermal energy supplement, such as by pre-heating a substrate, in-situ heating of a growing film, and/or post-annealing of the as-deposited film, can convert the disordered FCC film structure to a chemically ordered FCT film structure which shows a large magnetic coercivity and an anisotropy energy beyond 5.0 kOe and $10^7$ ergs/cc, respectively. The changes in coercivity and/or anisotropy energy can be regarded as being proportional to the degree of FCT transformation in the FePt film.

Thin film fabrication processes using external thermal energy supplements, such as the pre-heating a substrate, in-situ heating of a growing film, and/or post-annealing of an as-deposited film, have been used for Cr segregation in CoCr based alloy films and phase transformation in FePt based alloy films. However, such external energy processes limit the deposition environments in terms of high temperature facilities and materials, and add fabrication cost.

Because the currently used external heating methods require treatment using temperatures beyond 600° C. and long heat treatment times of more than 1 hour to achieve high coercivity and/or anisotropy energy, the fabrication of such films usually requires expensive film production equipment and high system maintenance costs, which are not practical for the large scale production of the film. To reduce the required temperature and time parameters, an alternative method to fully or partially compensate for the external energy supplements should be developed.

Thus there is a need for a thin film fabrication process, which can fully or partially compensate for the external energy supplement in the manufacture of information data storage media, including magnetic and optic recording films.

SUMMARY OF THE INVENTION

This invention provides a method of manufacturing a thin film of magnetic material, comprising sputtering magnetic material from a target to a substrate to form a thin film of the magnetic material on the substrate, wherein the ratio of sputtering power in Watt to sputtering pressure in mTorr is greater than one. The target can include at least two of: Fe, Co, Ni, Cr, Pt and Pd. The sputtering pressure can be greater than 100 mTorr. The sputtering power can be greater than 300 Watts. The thin film can comprise a face centered tetragonal structure, including at least two of: Fe, Co, Ni, Cr, Pt and Pd. The substrate can comprise one of: glass, MgO, or silicon. The thin film can have a magnetic coercivity greater than 10 kOe. The method can further comprise annealing the thin film. The thickness of the thin film can be in the range of 5 nm to 200 nm.

Thin films of magnetic material made according to the method and magnetic storage media including a thin film of magnetic material made according to the method are also included.

In another aspect, the invention encompasses a thin film of magnetic material comprising a plurality of face centered tetragonal particles produced by thermalizing face centered cubic particles in a plasma during a plasma deposition process. The particles can comprise an alloy selected from the group of: FePd, FeNiPt, FeNiPd, CoPt, CoPd, CoNiPt, and CoNiPd. The thickness of the film can be in the range of 5 nm to 200 nm.

DETAILED DESCRIPTION OF THE DRAWINGS

DETAILED DESCRIPTION OF THE INVENTION

This invention provides a self-annealed thin film deposition process that uses internally thermalized energy resulting from a combination of acceleration energy and plasma density during sputtering deposition.

Figure 1:
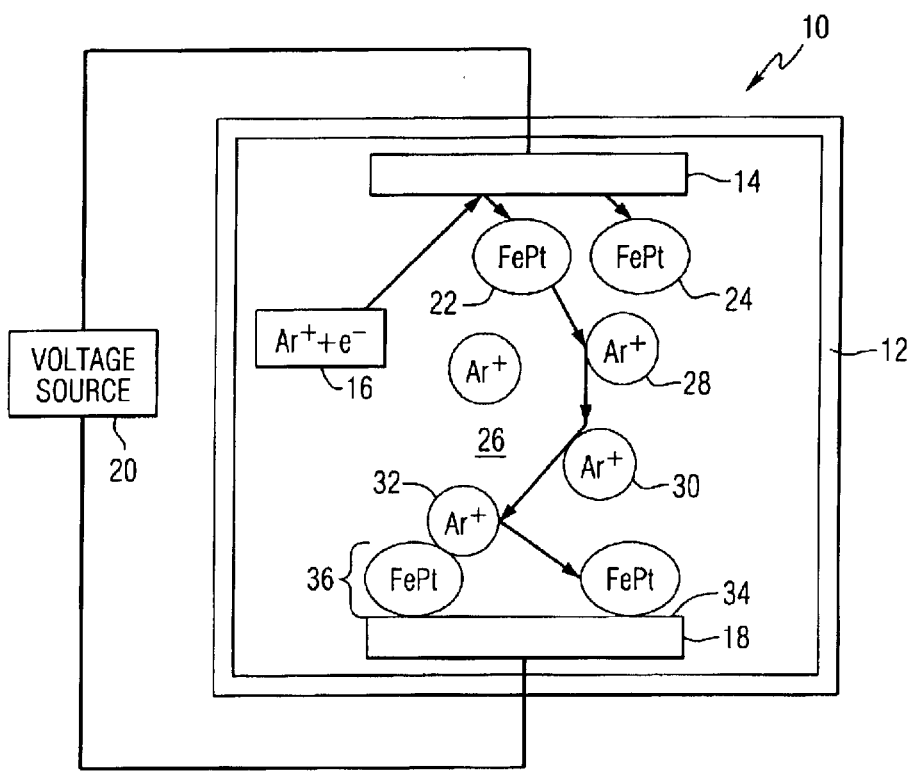
FIG. 1 is a schematic representation of a sputtering system that can be used to perform the method of this invention.

Referring to the drawings, FIG. 1 is a schematic representation of a sputtering system 10 that can be used to perform the method of this invention. The system includes a sputtering chamber 12 containing a target 14, and argon source 16 and a substrate 18. In one example the target can comprise FePt. The substrate can be any of several known substrates, including for example MgO, silicon or glass. A voltage source 20 is used to supply a voltage between the target and the substrate. The argon source supplies argon ions and electrons. Some of the argon ions strike the target and dislodge particles 22, 24 from the target. In this example the particles are FePt particles. The dislodged particles pass through a plasma 26 that includes a plurality of argon ions illustrated as items 28, 30, and 32. In the plasma, the particles collide with the argon ions. These collisions result in an increase in the thermal energy of the particles. This increase in thermal energy is referred to herein as thermalization. The thermalized particles are deposited on the surface 34 of the substrate and form a thin film of magnetic material 36. In this example, the target is FePt, and the thin film is FePt. However, the target and resulting thin film can include combinations of other materials such as Co, Ni, Cr and Pd. In the case of FePt based films, the as-deposited films are FCC structures and thermal energy contributes to the transformation to an FCT structure. This transformation from FCC to FCT also occurs in FePd, FeNiPt, FeNiPd, CoPt, CoPd, CoNiPt, CoNiPd, etc. In the case of CoCr based alloy films, the thermal energy contributes to the enhancement of the uniform Cr segregation around the Co atoms. A similar effect occurs with other alloys including CoCrPt, CoCrPd, etc.

Inert gases heavier than Ar gas can be used in place of the Ar gas, for example Kr or Xe gasses. With Kr or Xe, the thermalization process would be more effective since the mass of Kr or Xe is heavier than the mass of Ar. However, Kr and Xe gases are more expensive than Ar and compared with Ar, the plasma states of Kr and Xe gases are less stable in dense plasmas.

In the thermalization process, at least some of the dislodged particles will be converted from a face centered cubic structure to a face centered tetragonal structure. Thus the thin film can include a combination of face-centered cubic and face-centered tetragonal particles. To convert the face centered cubic particles in the thin film to face centered tetragonal structures, the film can be annealed. The annealing can be carried out at a temperature that is lower than that used in previously known techniques for converting the face centered cubic particles to face centered tetragonal structures, thereby saving energy.

Figure 2:
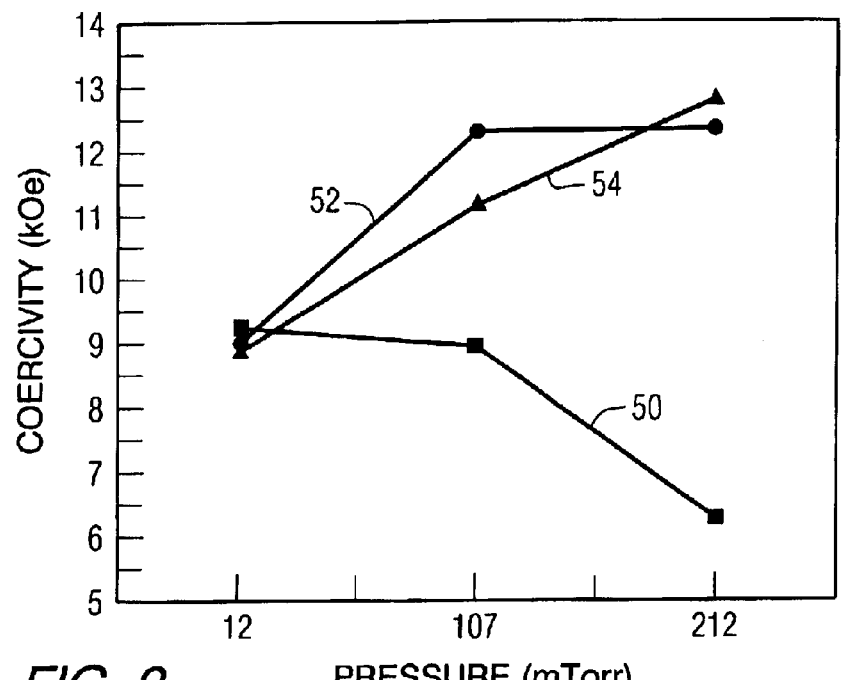
FIG. 2 is a graph showing the effects of plasma density on the coercivity of sputter deposited, post annealed FePt films.

To investigate the interaction effect of the thermalization process on the magnetic coercivity (Hc) of FePt films as the degree of FCT phase transformation by thermal energy, experiments were conducted using two factors (acceleration energy and plasma density) and three levels (low/dilute, intermediate/medium and high/dense). FIG. 2 is a graph showing the effects of plasma density on the coercivity of sputter deposited, post-annealed FePt films. The Hc of the FePt films was measured under an applied magnetic field of 20 kOe, after post-annealing at 450° C. for 30 min. In FIG. 2, line 50 represents the data for a low energy process (100 watts), line 52 represents the data for a medium energy process (300 watts), and line 54 represents the data for a high-energy process (500 watts). The horizontal axis in FIG. 2 represents the sputter pressure. A higher sputter pressure corresponds to a higher plasma density. The pressure of 12 mTorr represents a dilute density plasma, 107 mTorr represents a medium density plasma, and 212 mTorr represents a dense plasma. The data in FIG. 2 show that for a low energy process, the coercivity of the FePt film decreased with increasing plasma density. For both the medium energy process and the high energy process, the coercivity increased as the plasma density increased.

At a dilute plasma density and a conventional sputtering pressure of several mTorr, there is little difference in Hc as the, function of the acceleration energy. At this sputtering plasma density, because the frequency of the conflicts is quite rare and the plasma temperature is relatively low, the self-annealed process by the thermalization mechanism hardly occurs for the FePt films. Moreover, as the plasma density increases up to the medium level of sputtering pressure in tenths to a hundred mTorr, there is distinct difference in Hc as the function of the acceleration energy. When the intermediate acceleration energy (300 watts) is applied during the deposition, the degree of the thermalization is already maximized in the medium plasma density. When the films are deposited in the dense plasma, the discrepancy in Hc as the function of the acceleration energy is more definite. Even the applied high acceleration energy causes a linear increase of the Hc as the function of the plasma density. This result shows that the maximum thermalization can be obtained in the simultaneously high acceleration energy and dense plasma, because the thermalization results from an interaction of the two parameters.

Table 1 shows the ratios of sputtering power (W) to sputtering pressure (mTorr) for the data points in FIG. 2, for a sputtering system with a 50 mm sputtering target to substrate distance.

TABLE 1

Ratio of the Sputtering Power to the Sputtering Pressure in W/mTorr

| | Dilute plasma density | Medium plasma density | Dense plasma density |
|---|---|---|---|
| Low acceleration energy | 8.3 | 0.9 | 0.5 |
| Intermediate acceleration energy | 25.0 | 2.8 | 1.4 |
| High energy acceleration energy | 41.7 | 4.7 | 2.4 |

Because the thermalization process creates film having improved magnetic coercivity when operated beyond the intermediate acceleration energy and medium plasma density, the sputtering pressure should be higher than 100 mTorr and the ratio of the energy in Watt to density (pressure) in mTorr should be larger than 1. For the sufficient thermalization effect on the FePt films, the following conditions should be satisfied, $$100 \text{ mTorr} < Pr \quad \text{(Equation 2)}$$

$$(Pw/Pr) > 1 \quad \text{(Equation 3)}$$

where, Pr is the sputtering pressure, and Pw is the sputtering power.

Figure 3:
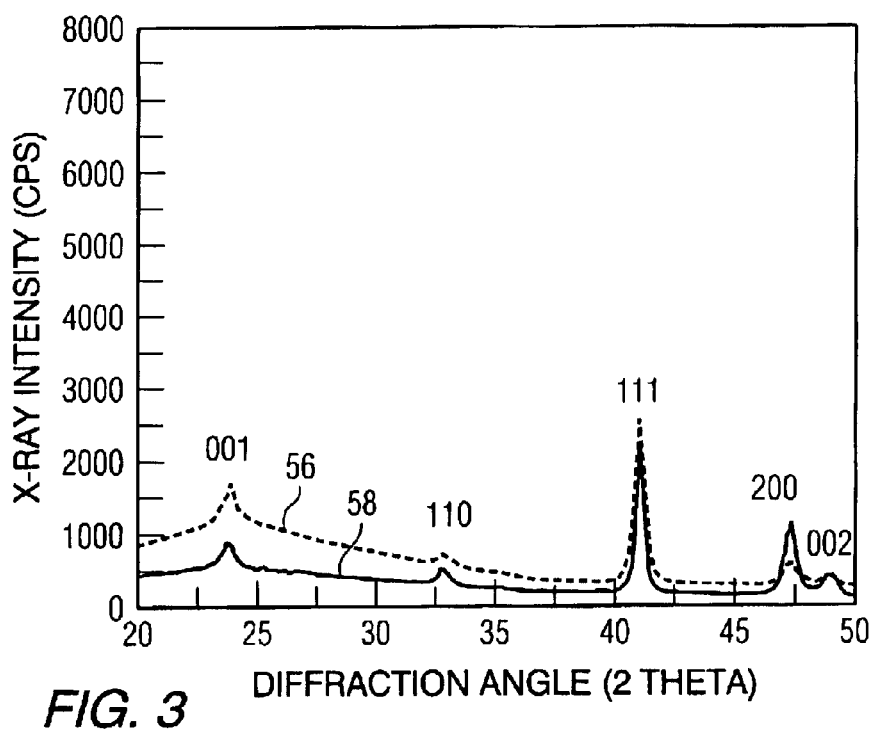
FIG. 3 shows the crystallographic diffraction peaks of post annealed FePt films deposited by low and high acceleration energies in a dilute plasma.

FIG. 3 shows the crystallographic diffraction peaks of post-annealed FePt films deposited by low and high acceleration energies, of 100 and 500 watts respectively, in a dilute density plasma (12 mTorr). In each case, after sputter deposition, the films were annealed at 450° C. for 30 minutes. In FIG. 3, line 56 illustrates the diffraction peaks for a FePt film deposited in a low energy dilute plasma, and line 58 illustrates the diffraction peaks for a FePt film deposited in a high energy dilute plasma.

Figure 4:
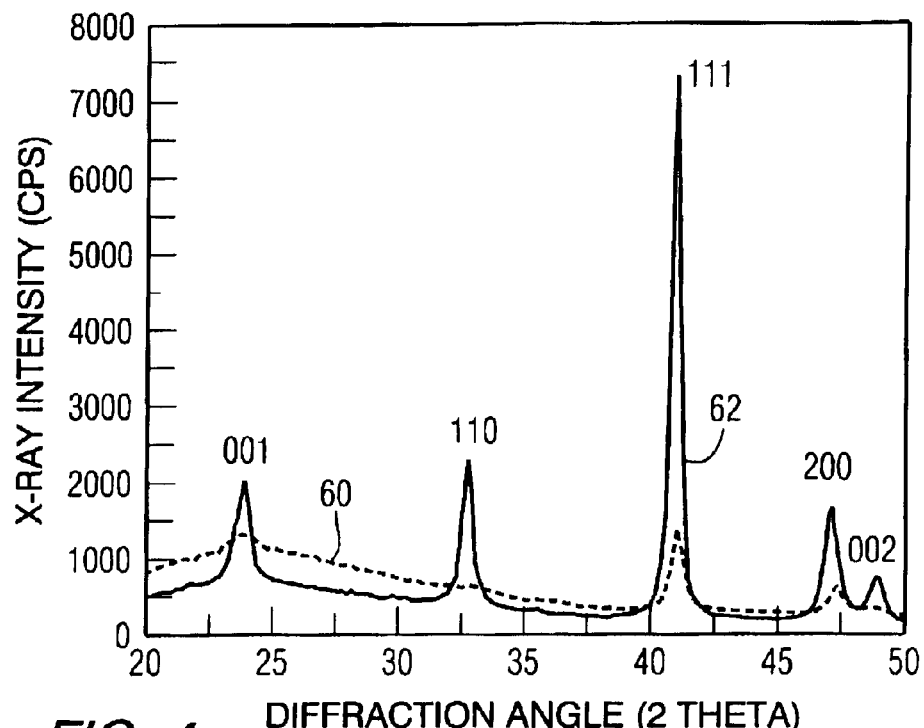
FIG. 4 shows the crystallographic diffraction peaks of post annealed FePt films deposited by low and high acceleration energies in a dense plasma.

FIG. 4 shows the crystallographic diffraction peaks of post-annealed FePt films deposited by low and high acceleration energies, of 100 and 500 watts respectively, in a dense plasma (212 mTorr). In each case, after sputter deposition, the films were annealed at 450° C. for 30 minutes. In FIG. 4, line 60 illustrates the diffraction peaks for a FePt film deposited in a low energy dense plasma, and line 62 illustrates the diffraction peaks for a FePt film deposited in a high energy dense plasma.

FIGS. 3 and 4 show the crystallographic diffraction curves of FePt films deposited at dilute and dense plasma density, respectively with low and high acceleration energy as indicated in FIG. 2 and Table 1. The FePt films deposited in dilute plasma density in FIG. 3 show the chemically ordered FCT structures with super lattice peaks of (001) and (002), but little difference in the peak intensities of the films between low and high acceleration energies. This indicates that the similar degrees of FCT transformations in the films occur in dilute plasma density, regardless of the degree of the acceleration energy. When the plasma density is dilute during the sputtering deposition, the sputtered atoms and particles have a lower probability of conflicting with the plasma ions so that the plasma temperature is hardly increased despite the collisions with the highly accelerated atoms and particles. Thus there is little difference in the FCT transformation in the dilute plasma density. This supports the hypothesis regarding the mechanism behind the data in FIG. 2.

When the FePt films are deposited in the dense plasma by low and high acceleration energies, super lattice peaks corresponding to a chemically ordered FCT structure can be detected in both of the films as shown in FIG. 4. However, the distinct difference in the peak intensities between low and high acceleration energies is measured. As predicted by the data in FIG. 2, when the plasma density is dense, the possibility for conflict between accelerated atoms and particles, and plasma ions is enhanced. During the conflict process, large portions of the acceleration energy convert to thermal energy in the dense plasma which elevates the plasma temperature. But when the accelerated energy is not sufficient for the atoms and particles to pass through the dense plasma, the plasma temperature cannot be fully elevated and even the component atoms and particles cannot arrive on the substrate surface. So only high acceleration energy can increase the plasma temperature and transport the atoms and particles to the surface of the substrate.

The above results demonstrate the fact that the self-annealed process by thermalization phenomenon hardly occurs at conventional sputtering pressure, regardless of the acceleration energy and cannot be effectively created in the dense sputtering pressure without sufficient acceleration sputtering energy. Therefore, both a high plasma density and a high acceleration energy are simultaneously used for the effective thermalized process in the FePt films.

Figure 5:
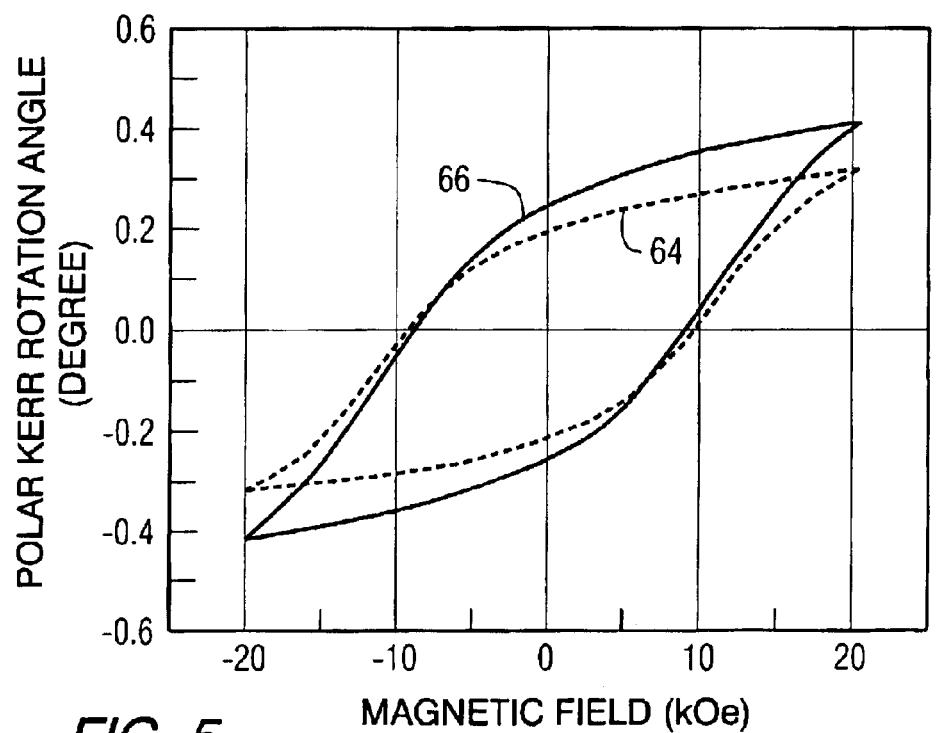
FIG. 5 show magnetic hysteresis loops of post annealed FePt films deposited by low and high acceleration energies in a dilute plasma.

FIG. 5 show magnetic hysteresis loops of post-annealed FePt films deposited by low and high acceleration energies, of 100 and 500 watts respectively, in a dilute density plasma (12 mTorr). In each case, after sputter deposition, the films were annealed at 450° C. for 30 minutes. In FIG. 5, loop 64 illustrates the hysteresis loop for a FePt film deposited in a low energy dilute plasma, and loop 66 illustrates the hysteresis loop for a FePt film deposited in a high energy dilute plasma.

Figure 6:
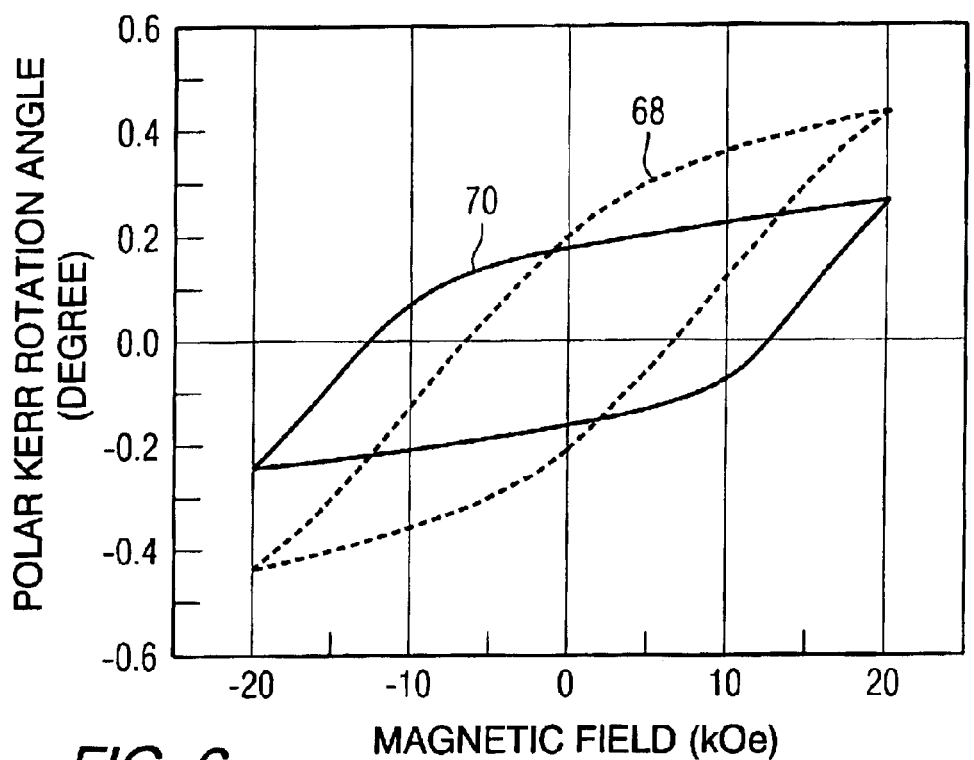
FIG. 6 show magnetic hysteresis loops of post annealed FePt films deposited by low and high acceleration energies in a dense plasma.

FIG. 6 show magnetic hysteresis loops of post-annealed FePt films deposited by low and high acceleration energies, of 100 and 500 watts respectively, in a dense density plasma (212 mTorr). In each case, after sputter deposition, the films were annealed at 450° C. for 30 minutes. In FIG. 6, loop 68 illustrates the hysteresis loop for a FePt film deposited in a low energy dense plasma, and loop 70 illustrates the hysteresis loop for a FePt film deposited in a high energy dense plasma.

FIG. 5 and FIG. 6 show the magnetic hysteresis loops of the FePt films deposited at dilute and dense plasma density, respectively with low and high acceleration energy, as indicated in FIG. 2 and Table 1, and corresponding to FIG. 3 and FIG. 4, respectively. As expected from FIG. 3, little difference in coercivity (Hc) is found in the FePt film deposited in the dilute plasma density, regardless of the acceleration energy as shown in FIG. 5, because the peak intensities of the FCT transformation in the FePt films were at quite similar levels as shown in FIG. 3. This implies that the self-annealed deposition process by the thermalization mechanism hardly occurs in dilute plasma density, regardless of the acceleration energy. On the other hand, the degree of the self-annealed process by the thermalization mechanism in the dense plasma density strongly depends on the acceleration energy as shown in FIG. 6. The self-annealed FePt films produced by the thermalization of the high acceleration energy in dense plasma show a Hc of more than 12 kOe, but the film produced at a low acceleration energy in dense plasma show a Hc of less than 6 kOe. This difference in Hc can be expected from the peak intensities in FIG. 4 which are proportional to the degree of FCT transformation structure. The dependence of the magnetic property (Hc) on the degree of thermalization verifies the self-annealed process in the FePt films as well as the crystalline property (Peak intensities).

The degree of the thermalization (DT) for the self-annealed process in the chemically ordered FePt FCT structured films can be expressed as follows, $$DT = Eacc \times Pd \tag{Equation 4}$$

$$DT = Pw \times Pr \tag{Equation 5}$$

(or merely, Pw/Pr>1) where, Eacc is the acceleration energy of component atoms/particles; Pd is the sputtering plasma density; Pw is the sputtering power (in watts); and Pr is the sputtering pressure (in mTorr).

Figure 7:
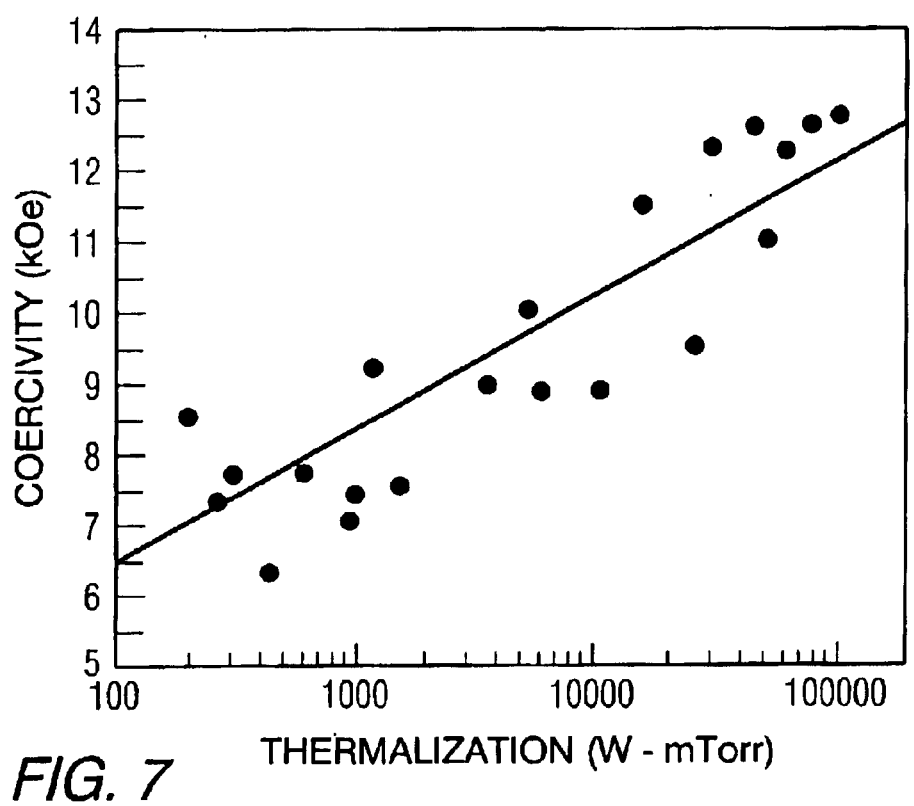
FIG. 7 is a graph showing the change of coercivity in post annealed FePt films as the function of the thermalization (product of the sputtering power and pressure).

FIG. 7 is a graph showing the change of coercivity in post-annealed FePt films as the function of the thermalization (product of sputtering power and pressure). The films were annealed at 450° C. for 30 minutes. The thermalization axis is logarithmic.

FIG. 7 shows the change of coercivity, which is related to the degree of the ordered FCT transformation in the FePt films, after the post annealing at 450° C. for 30 min as the function of the thermalization. The coercivity of the films is linearly proportional to the logarithm of the degree of the thermalization (product of the sputtering pressure and sputtering power), as follows, $$\text{Degree of FCT transformation} = 1.9 \log(DT) + 2.6 \tag{Equation 6}$$

This invention provides a process for self-annealed thin film growth by using a thermalized plasma during the sputtering deposition process which can fully or partially compensate for the external energy supplements previously used in the fabrication of the films. The degree of chemically ordered FCT transformation is controlled by controlling acceleration energy and plasma density during sputter deposition of the films.

During the sputtering deposition process, the atoms and particles sputtered from the surface of the target are accelerated toward the electrically grounded substrate, encountering, conflicting with, and scattering the plasma ions. In this process, the energy of the accelerated atoms and particles, which is proportional to the electric power difference between the cathode target and grounded substrate partially converts to thermal energy to heat up the plasma temperature, and partially converts to kinetic energy to transport the atoms and particles to the surface of the substrate. The electric power (electric energy of an electron (Volt) times the number of electrons (Current)) is transferred into the thermal energy of the plasma. When the sputtering power is input in a sputtering system, the voltage and current corresponding to the power can be displayed.

When the plasma ion density is dilute in the sputtering plasma, the possibility of the conflict between component atoms and particles, and plasma ions is quite rare. In this case, there is only a small conversion of the acceleration energy to thermal energy in the dilute plasma. As the result, the deposited film on the surface of the substrate shows a low degree of the thermalization. On the other hand, when the plasma ion density is quite dense, the probability of conflict between the component atoms and particles, and plasma ions is increased so that more of the acceleration energy converts to thermal energy to increase the plasma temperature in the dense plasma. As the result, the films deposited on the substrate surface show a high degree of thermalization because of the high temperature plasma. For the purposes of this description, the thermalization refers to frequent conflicts between energetic sputtered particles (for example FePt) with ions (for example Ar) in the plasma state. Thermalized films refer to films deposited by a thermalization process.

When the thermalization process is applied to FePt thin film deposition, the internally thermalized energy created by the process is effectively transferred to Fe/Pt atoms and particles, and transforms them to the chemically ordered FCT FePt film which can fully or partially compensate for the external thermal energy that has been used in previous processes to cause the FCT transformation. The self-annealed process of this invention using internally thermalized energy is more effective for the transformation than externally supplied energy, because the active surface areas in the Fe/Pt atoms and particles are larger than those in FePt continuous films.

While the several examples show films that were annealed at 450° C. for 30 minutes, alternatively, the films could be annealed at temperatures of less than 500° C. for less than one hour.

The experimental results show strong evidence that a self-annealed deposition process by the thermalization mechanism can partially or fully compensate for the previously required external thermal energy for the transformation of chemically ordered FCT structure in the FePt films.

While the invention has been described in terms of several examples, it will be apparent to those skilled in the art that various changes can be made to the disclosed examples without departing from the scope of the invention as defined by the following claims.

What is claimed is:

1. A method of manufacturing a thin film of magnetic material, the method comprising:

sputtering magnetic material from a target to a substrate to form a thin film of the magnetic material on the substrate, wherein the ratio of sputtering power in Watt to sputtering pressure in mTorr is greater than one, and the sputtering pressure is greater than 100 mTorr.

2. The method of claim 1, wherein the target includes at least two of: Fe, Co, Ni, Cr, Pt and Pd.

3. The method of claim 1, wherein the sputtering power is greater than 300 Watts.

4. The method of claim 1, wherein the thin film comprises a face centered tetragonal structure.

5. The method of claim 1, wherein the thin film includes at least two of: Fe, Co, Ni, Cr, Pt and Pd.

6. The method of claim 1, wherein the substrate comprises one of: glass, MgO, or silicon.

7. The method of claim 1, wherein the thin film has a magnetic coercivity greater than 10 kOe.

8. The method of claim 1, further comprising:

annealing the thin film.

9. The method of claim 8, wherein the step of annealing the thin film comprises:

heating the thin film to a temperature of 450° C. for a time period greater than 30 minutes.

10. The method of claim 8, wherein the step of annealing the thin film comprises:

heating the thin film to a temperature of less than 500° C. for a time period of less than one hour.

11. The method of claim 1, wherein the thickness of the thin film is in the range of 5 nm to 200 nm.

12. The method of claim 1, wherein the sputtering step comprises:

bombarding the target with argon ions.

13. The method of claim 1, wherein the thin film includes an alloy selected from the group of: FePd, FeNiPt, FeNiPd, CoPt, CoPd, CoNiPt, and CoNiPd.

14. The method of claim 1, wherein the thin film includes an alloy selected from the group of: CoCrPt and CoCrPd.

* * * * *

UNITED STATES PATENT AND TRADEMARK OFFICE
CERTIFICATE OF CORRECTION

PATENT NO. : 6,780,291 B2  Page 1 of 1
APPLICATION NO. : 10/227756
DATED : August 24, 2004
INVENTOR(S) : Jai-Young Kim It is certified that error appears in the above-identified patent and that said Letters Patent is hereby corrected as shown below:

Title page,
Item [74], *Attorney, Agent, or Firm*, "Pletragallo" should read -- Pietragallo --.
Item [56] References Cited, OTHER PUBLICATIONS,
"M.L. Williams et al.", reference, "Analytical" should read -- An Analytical --; and insert -- S.H. Charap et al., "Thermal Stabiltity of Recorded Information at High Densities," IEEE Transaction on Magnetics, Vol. 33, No. 1, January 1997, pp. 978-983. --.

Signed and Sealed this

Twenty-seventh Day of June, 2006

JON W. DUDAS
*Director of the United States Patent and Trademark Office*